United States Patent [19]

Muza

[11] Patent Number: 6,084,467
[45] Date of Patent: Jul. 4, 2000

[54] ANALOG AMPLIFIER CLIPPING CIRCUIT

[75] Inventor: John M. Muza, Plano, Tex.

[73] Assignee: Texas Instruments Incorporated, Dallas, Tex.

[21] Appl. No.: 09/414,409

[22] Filed: Oct. 7, 1999

Related U.S. Application Data

[60] Provisional application No. 60/106,502, Oct. 30, 1998.

[51] Int. Cl.$^7$ .................................................. H03F 3/45
[52] U.S. Cl. ............................ 330/69; 330/86; 327/309
[58] Field of Search .................................. 330/2, 51, 69, 330/86, 110; 327/309, 312

[56] References Cited

U.S. PATENT DOCUMENTS

| | | | |
|---|---|---|---|
| 4,070,632 | 1/1978 | Tuttle | 330/86 |
| 4,849,708 | 7/1989 | Brehmer et al. | 330/110 |
| 5,175,508 | 12/1992 | Gingrich et al. | 330/86 |
| 5,412,346 | 5/1995 | Burger, Jr. et al. | 330/86 |
| 5,952,883 | 8/1999 | Masuta | 330/86 |

*Primary Examiner*—Robert Pascal
*Assistant Examiner*—Khanh Van Nguyen
*Attorney, Agent, or Firm*—Alan K. Stewart; Wade James Brady, III; Frederick J. Telecky, Jr.

[57] ABSTRACT

An analog clipping circuit includes: a main amplifier 20; a feedback resistor 26 coupled between a first input of the main amplifier 20 and an output of the main amplifier 20; a first current source 50 coupled in parallel with the feedback resistor 26; a first clipping amplifier 42 coupled to the first current source 50 for controlling the first current source 50, the first clipping amplifier 42 having a first input coupled to an output of the main amplifier 20 and a second input coupled to a first reference node; a second current source 54 coupled in parallel with the feedback resistor 26; and a second clipping amplifier 44 coupled to the second current source 54 for controlling the second current source 54, the second clipping amplifier 44 having a first input coupled to an output of the main amplifier 20 and a second input coupled to a reference node.

18 Claims, 1 Drawing Sheet

ANALOG AMPLIFIER CLIPPING CIRCUIT

This application claims priority under 35 USC § 119 (e)(1) of provisional application Ser. No. 60/106,502 filed Oct. 30, 1998.

FIELD OF THE INVENTION

This invention generally relates to electronic systems and in particular it relates to analog amplifier clipping circuits.

BACKGROUND OF THE INVENTION

Accurate analog clipping control of an amplifier's output nodes is important for applications such as mixed signal codecs. Most prior art codecs are a combination of analog input and digital output. For example, one type of codec has an analog amplifier providing the analog input to a sigma-delta analog to digital (A/D) converter. When the analog signal corresponding to the maximum digital value of the A/D converter is less than the dynamic range of the amplifier, the A/D converter and a corresponding digital filter can overload. When the digital filter overloads, internal clipping mechanisms prevent wrap around of the digital signal. This creates a digital representation of a trapezoidal signal that contains harmonics with sufficient power to increase the FM modulation depth to undesirable levels.

SUMMARY OF THE INVENTION

The analog clipping circuit includes: a main amplifier; a feedback resistor coupled between a first input of the main amplifier and an output of the main amplifier; a first current source coupled in parallel with the feedback resistor; a first clipping amplifier coupled to the first current source for controlling the first current source, the first clipping amplifier having a first input coupled to an output of the main amplifier and a second input coupled to a first reference node; a second current source coupled in parallel with the feedback resistor; and a second clipping amplifier coupled to the second current source for controlling the second current source, the second clipping amplifier having a first input coupled to an output of the main amplifier and a second input coupled to a reference node.

DETAILED DESCRIPTION OF PREFERRED EMBODIMENTS

Figure 1:
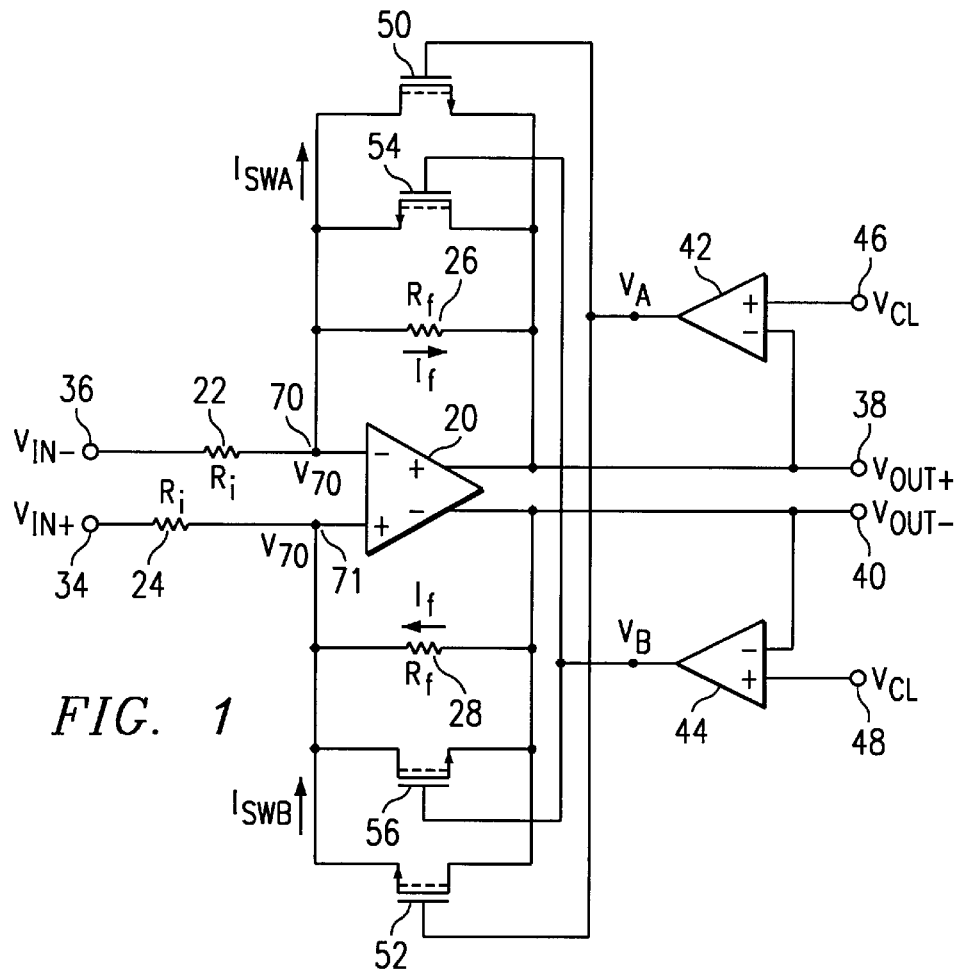
FIG. 1 is a schematic circuit diagram of a preferred embodiment differential analog amplifier clipping circuit.

The preferred embodiment circuits are designed to limit the output voltage swings of either a fully differential or single ended amplifier gain cell. The circuits employ an analog negative feedback loop to control the current through the main amplifier feedback resistor. A preferred embodiment analog amplifier clipping circuit is shown in FIG. 1. The circuit of FIG. 1 is a fully differential circuit, but the circuit can also be implemented as a single ended circuit. The circuit of FIG. 1 includes amplifier 20, resistors 22, 24, 26, and 28, positive input node 34, negative input node 36, positive output node 38, negative output node 40, feedback amplifiers 42 and 44, and low clip voltage nodes 46 and 48, and transistors 50, 52, 54, and 56. Both clipping amplifiers 42 and 44 have P-channel input stages, as does the main amplifier 20. This accommodates the optimum common-mode levels at which the amplifiers must operate. The transistors 50, 52, 54, and 56 serve as current sources that are controlled by the output voltages from feedback amplifiers 42 and 44. As either output voltage $V_{out-}$ or output voltage $V_{out+}$ reaches the low clip voltage $V_{c1}$, the transistors 50, 52, 54, and 56 divert any additional current so that the current $I_f$ can remain constant, thus keeping output voltage $V_{out+}$ or $V_{out-}$ at the clipping level $V_{c1}$.

When output voltage $V_{out+}$ is greater than clipping voltage $V_{c1}$, clipping amplifier 42 has its minus input terminal larger than its positive input terminal. This causes the output voltage $V_A$ of amplifier 42 to be a low voltage $(A_1 * (V_{c1} - V_{out+}))$ where $A_1$ is the gain of amplifier 42). While the output voltage $V_A$ of amplifier 42 30 is at a low voltage, transistors 50 and 52 remain off, keeping the normal operation of the circuit unchanged.

Due to the nature of differential signals ($V_{out+}$ and $V_{out-}$ are inverse of each other), the output $V_B$ of amplifier 44 is also a low 35 voltage during normal operation, and transistors 54 and 56 are off. Normal operation is defined by the peak voltage swing of $|V_{mid} - V_{out+}|$ and $|V_{mid} - V_{out-}|$ is less than $|V_{mid} - V_{c1}\uparrow$, where $V_{mid}$ is the supply voltage divided by two.)

In the circuit of FIG. 1, as voltage $V_{out+}$ becomes very close to voltage $V_{c1}$, the amplifier 42 becomes active and control voltage $V_A$ begins to rise. Amplifier 42 tries to keep it's input terminals equal because of it's gain and the negative feedback loop it has just formed. As voltage $V_{out+}$ tries to go lower than voltage $V_{c1}$ the amplifier 42 becomes active and control voltage $V_A$ increases. This causes the current $I_{sw}$ in transistor 50 to increase which tries to bring voltage $V_{out+}$ higher. This is further explained by the following equations for the current at node 70.

$$(V_{in-} - V_{70})/R_i = (V_{70} - V_{out+})/R_f + I_{swA}$$

$$V_{in-} - V_{70} = (R_i/R_f) * (V_{70} - V_{out+}) + I_{swA} R_i$$

$$(R_i/R_f) V_{out+} = V_{70}(b\ 1 + R_i/R_f) - V_{in-} + I_{swA} R_i$$

Ideally the voltage at node 70 does not move due to the feedback. For voltage $V_{out+}$ to stay constant when voltage $V_{in-}$ keeps increasing, current $I_{swA}$ must increase. The feedback loop dynamically varies current $I_{swA}$ to keep voltage $V_{out+}$ approximately equal to clipping voltage $V_{c1}$. Once voltage $V_{out+}$ clips to a constant level, the common-mode feedback circuit of the main amp 20 will clip voltage $V_{out-}$ on the high side because $(V_{out+} + V_{out-})/2 = V_{cm} - V_{mid}$. $V_{cm}$ is the common-mode voltage. The transistor 52 will also turn on in this cycle. This helps to keep the input common-mode $V_{70}$ constant. The current equations for node 71 are shown below.

$$(V_{out-} - V_{70})/R_f + I_{swB} = (V_{70} - V_{in+})/R_i$$

$$V_{70} = (V_{out-} + I_{swB} R_f + V_{in+}(R_f/R_i))/(1 + R_f/R_i)$$

If $V_{out-}$ is constant, $V_{in+}$ is getting smaller, $I_{swB}$ is getting larger so that $V_{70}$ can remain constant. Due to the polarity of the transistors 50 and 52, and signal swings involved, current $I_{swB}$ is less than current $I_{swA}$, therefore voltage $V_{70}$ will get smaller by some amount. This is tolerable for large gain variations, $R_f/R_i$, because amplifier 20 is a P-channel input pair type amp. This assumes the width to length ratio of transistor 50 is equal to the width to length ratio of transistor 52. The width to length ratio of transistor 52 can be made greater than the width to length ratio of transistor 50 to increase the current through transistor 52 for a given control voltage $V_A$. This will hold the input common-mode level even closer to the ideal case. Without transistor 52, this scheme will stop working when the voltage at node 70 drops so low that the common-mode feedback circuit of amplifier 20 stops working.

The steps of operation are as follows. When voltage $V_{out+}$ and voltage $V_{out-}$ have not reached clip voltage $V_{c1}$, control signals $V_A$ and $V_B$ are at a low level. This is the normal operation with all feedback transistors 50, 52, 54, and 56 off (high impedance). When voltage $V_{out+}$ or voltage $V_{out-}$ reaches clip voltage $V_{c1}$, amplifier 42 or 44 becomes active and a negative feedback loop is closed through transistors 50 and 52, or transistors 54 and 56. This clips output node voltage $V_{out+}$ or $V_{out-}$ to voltage $V_{c1}$. The common-mode feedback circuit of amplifier 20 clips the other side, because $(V_{out+}+V_{out-})/2=V_{cm}$. Because transistor 52 does not carry equal current as transistor 50, and transistor 54 does not carry equal current as transistor 56, both input terminals of amplifier 20 will drop. This can be adjusted by making the width to length ratios of transistors 52 and 54 larger.

Figure 2:
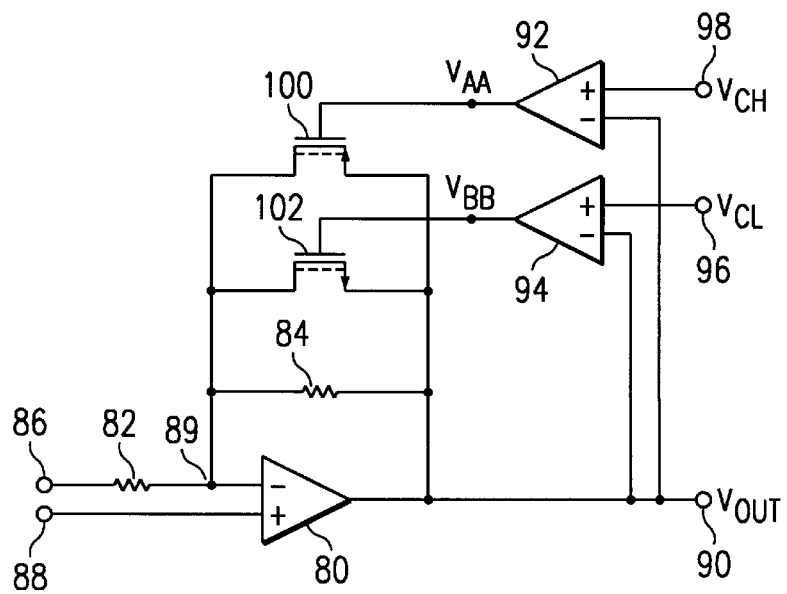
FIG. 2 is a schematic circuit diagram of a preferred embodiment single-ended analog amplifier clipping circuit.

A single-ended version of the analog clipping circuit is shown in FIG. 2. The circuit of FIG. 2 includes amplifier 80, resistors 82 and 84, input node 86, $V_{mid}$ node 88, output node 90, feedback amplifiers 92 and 94, low clip voltage node 96, high clip voltage node 98, and transistors 100 and 102. The single-ended circuit of FIG. 2 operates by the same general theory of the differential circuit of FIG. 1 with some differences in the implementation. The differential circuit of FIG. 1 relies on the symmetrical natures of $V_{out+}$ and $V_{out-}$. When $V_{out+}$ is clipping low, $V_{out-}$ must be clipping high. Therefore, only the low reference clipping voltage is used. For the single-ended circuit of FIG. 2, the signal is a complex single-ended waveform that needs two clipping reference voltages, a high clip voltage $V_{ch}$ and a low clip voltage $V_{c1}$.

Since there is a $V_{ch}$ reference, one clipping amp 92 must be an N-channel input stage and the other clipping amp 94 will remain a P-channel input stage. As shown in FIG. 2, amplifier 80 has one input terminal 88 tied to voltage $V_{mid}$. The gain of amplifier 80 and its feedback force the voltage on the other input terminal 89 to be $V_{mid}$ as well. Due to the polarity of the voltages and currents, one feedback switch is a PMOS transistor 100 and the other an NMOS transistor 102.

When $V_{c1}<V_{out}<V_{ch}$, the output of amplifier 92, voltage $V_A$, is high, and the output voltage of amplifier 94, voltage $V_{BB}$, is low, due to the same reasons given for the fully differential circuit of FIG. 2. When $V_{out}-V_{c1}$, control voltage $V_{BB}$ rises to turn on transistor 102 and complete the negative feedback loop through amp 94 and transistor 102. The current through transistor 102 increases, limiting the current in resistor 84 to a constant value even though the current in resistor 82 is increasing. When $V_{out} \geq V_{ch}$, control signal $V_{AA}$ lowers, turning transistor 100 on and achieving the same result of limiting the current in resistor 84 to a constant value. Therefore, the single-ended voltage $V_{out}$ will be clipped (limited) to a maximum and minimum reference voltage level. The following equations show the current relationships that yield the clipping result.

$$(V_{in}-V_{mid})/R_i=(V_{mid}V_{out})/R_f+I_{102}$$
$$V_{out}=V_{mid}(1+R_f/R_i)-(R_f/R_i)V_{in}+I_{102}R_F$$
$$(V_{out}-V_{mid})/R_f+I_{100}=(V_{mid}-V_{in})/R_i$$
$$V_{out}=V_{mid}(1+R_f/R_i)-V_{in}(R_f/R_i)-I_{100}R_f$$

$R_i$ is resistor 82. $R_f$ is resistor 84. $I_{102}$ is the current through transistor 102. $I_{100}$ is the current through transistor 100.

The polarities, due to the current flow, dictate the use of one P-channel (low $V_T$) transistor 100 and one N-channel (low $V_T$) transistor 102. As in the differential case of FIG. 1, a negative feedback loop is controlling the output at the clipping level. N-channel transistor 102 and P-channel transistor 100 act like voltage controlled current sources in a feedback loop to keep the current in resistor 84 constant, thus keeping $V_{out}$ constant (clipped to either $V_{ch}$ or $V_{c1}$)

Although the present invention has been described in detail, it should be understood that various changes, substitutions and alterations can be made without departing from the spirit and scope of the invention as defined by the appended claims. It is therefore intended that the appended claims encompass any such modifications or embodiments.

What is claimed is:

1. An analog clipping circuit comprising:

a main amplifier;

a feedback resistor coupled between a first input of the main amplifier and an output of the main amplifier;

a first current source coupled in parallel with the feedback resistor;

a first clipping amplifier coupled to the first current source for controlling the first current source, the first clipping amplifier having a first input coupled to the output of the main amplifier and a second input coupled to a first reference node;

a second current source coupled in parallel with the feedback resistor; and a second clipping amplifier coupled to the second current source for controlling the second current source, the second clipping amplifier having a first input coupled to the output of the main amplifier and a second input coupled to a second reference node.

2. The circuit of claim 1 wherein the first and second current sources are transistors.

3. The circuit of claim 1 wherein the first current source is a PMOS transistor.

4. The circuit of claim 1 wherein the second current source is an NMOS transistor.

5. The circuit of claim 1 further comprising a second input of the main amplifier coupled to a third reference node.

6. The circuit of claim 5 wherein the first input of the main amplifier is a negative input and the second input of the main amplifier is a positive input.

7. The circuit of claim 1 wherein the first input of the first clipping amplifier is a negative input and the second input of the first clipping amplifier is a positive input.

8. The circuit of claim 1 wherein the first input of the second clipping amplifier is a negative input and the second input of the second clipping amplifier is a positive input.

9. The circuit of claim 1 further comprising an input resistor coupled between the first input of the main amplifier and an input node.

10. An analog clipping circuit comprising:

a main amplifier;

a first feedback resistor coupled between a first input of the main amplifier and a first output of the main amplifier;

a first current source coupled in parallel with the first feedback resistor;

a second current source coupled in parallel with the first feedback resistor;

a second feedback resistor coupled between a second input of the main amplifier and a second output of the main amplifier;

a third current source coupled in parallel with the second feedback resistor;

a fourth current source coupled in parallel with the second feedback resistor;

a first clipping amplifier coupled to both the first current source and the third current source for controlling the first and third current sources, the first clipping amplifier having a first input coupled to the first output of the main amplifier and a second input coupled to a reference node; and a second clipping amplifier coupled to both the second current source and the fourth current source for controlling the second and fourth current sources, the second clipping amplifier having a first input coupled to the second output of the main amplifier and a second input coupled to the reference node.

11. The circuit of claim 10 wherein the first, second, third, and fourth current sources are transistors.

12. The circuit of claim 10 wherein the first, second, third, and fourth current sources are NMOS transistors.

13. The circuit of claim 10 wherein the first input of the main amplifier is a negative input and the second input of the main amplifier is a positive input.

14. The circuit of claim 10 wherein the first output of the main amplifier is a positive output and the second output of the main amplifier is a negative output.

15. The circuit of claim 10 wherein the first input of the first clipping amplifier is a negative input and the second input of the first clipping amplifier is a positive input.

16. The circuit of claim 10 wherein the first input of the second clipping amplifier is a negative input and the second input of the second clipping amplifier is a positive input.

17. The circuit of claim 10 further comprising an input resistor coupled between the first input of the main amplifier and an input node.

18. The circuit of claim 10 further comprising an input resistor coupled between the second input of the main amplifier and an input node.

* * * * *